United States Patent [19]
Dixon

[11] Patent Number: 5,888,303
[45] Date of Patent: Mar. 30, 1999

[54] GAS INLET APPARATUS AND METHOD FOR CHEMICAL VAPOR DEPOSITION REACTORS

[75] Inventor: Robert E. Dixon, Carson City, Nev.

[73] Assignee: R.E. Dixon Inc., Carson City, Nev.

[21] Appl. No.: 826,764

[22] Filed: Apr. 7, 1997

[51] Int. Cl.[6] .................................................. C23C 16/00
[52] U.S. Cl. ..................................... 118/715; 427/248.1
[58] Field of Search .................................. 118/715, 725; 204/298.07; 427/248.1

[56] References Cited

U.S. PATENT DOCUMENTS

| | | | |
|---|---|---|---|
| 3,717,439 | 2/1973 | Sakai | 23/277 R |
| 3,845,738 | 11/1974 | Berkman et al. | 118/49 |
| 4,340,568 | 7/1982 | Hirai et al. | 422/245 |
| 4,430,959 | 2/1984 | Ebata et al. | 118/697 |
| 4,508,054 | 4/1985 | Baumberger et al. | 118/718 |
| 4,632,058 | 12/1986 | Dixon et al. | 118/725 |
| 4,641,603 | 2/1987 | Miyazaki et al. | 118/724 |
| 4,772,485 | 9/1988 | Ebata | 427/8 |
| 4,801,474 | 1/1989 | Saitoh et al. | 427/248.1 |
| 4,961,399 | 10/1990 | Frijlink | 118/730 |
| 4,982,693 | 1/1991 | Ebata | 118/666 |
| 4,987,855 | 1/1991 | Ahlgren | 118/722 |
| 5,062,386 | 11/1991 | Christensen | 118/725 |
| 5,174,825 | 12/1992 | White, Jr. et al. | 118/715 |
| 5,244,500 | 9/1993 | Ebata | 118/697 |
| 5,256,162 | 10/1993 | Drowley et al. | 29/25.01 |

OTHER PUBLICATIONS

Applied Materials Incorporated, *Applied Materials Instruction Manual,* AMV–500/800/1200 Vertical Epitaxial Reactor Systems, undated, pp. 1–26.

United States Fused Quartz Company, Inc., *Manufacturers and Fabricators of Fused Quartz,* Supplement No. 3, undated, pp. 1–47.

*Primary Examiner*—Robert Kunemund
*Assistant Examiner*—Jeffrie R. Lund
*Attorney, Agent, or Firm*—Howrey & Simon

[57] ABSTRACT

A gas inlet apparatus and method for introducing gas streams into the process chamber of a chemical vapor deposition reactor. The inlet includes conduits that are coaxially arranged and spaced radially apart, with the passageways formed therebetween carrying the gas streams. A conical surface is provided at the stream-exiting end of the inlet so that gases impinge upon it and are then dispersed within the reactor.

17 Claims, 5 Drawing Sheets

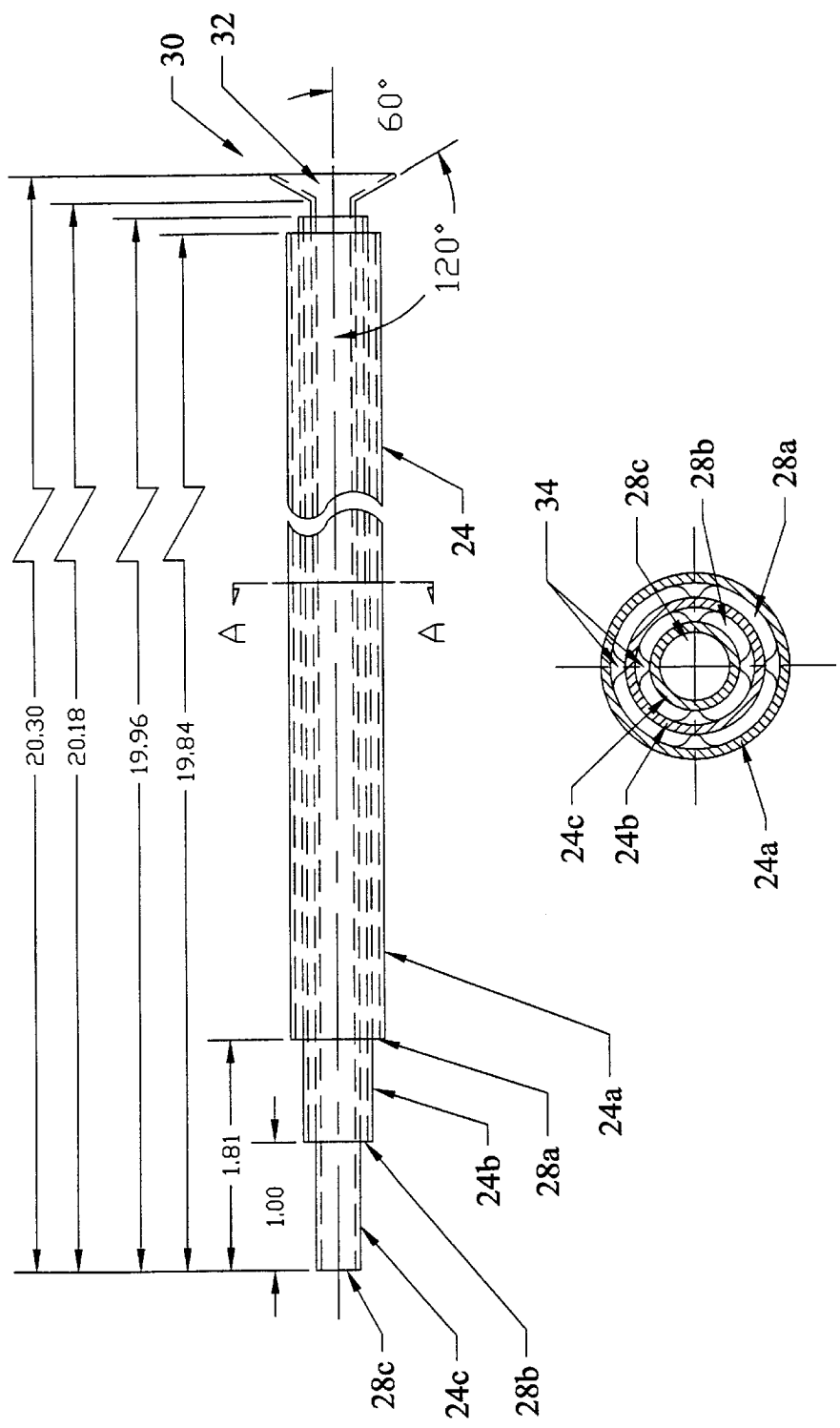

GAS INLET APPARATUS AND METHOD FOR CHEMICAL VAPOR DEPOSITION REACTORS

BACKGROUND OF THE INVENTION

1. Field of the Invention

The invention relates to chemical vapor deposition ("CVD") reactors. More particularly, the invention relates to an improved apparatus and method for introducing gases into a process chamber of a CVD reactor.

2. Description of Related Art

The manufacture of semiconductor devices relies substantially upon the ability to deposit materials on a semiconductor substrate in a highly controllable manner. Not only must the physical layout of the various active and passive layers be highly controlled, but the uniformity and repeatability of results from chip to chip and wafer to wafer must be reliable. Failure to achieve such consistent, reliable and controllable results translates into problems ranging from low manufacturing yields to products that are partially or wholly inoperable.

One known method of semiconductor processing technology involves chemical vapor deposition ("CVD"). According to this method, the semiconductor substrate is maintained in a heated process chamber into which select gases are introduced. Within the chamber, which may be held at atmosphere or evacuated to a vacuum, the gases chemically react to deposit material on the substrate. This process is carried out through apparatus commonly referred to as CVD reactors. One example of such a reactor is the subject of U.S. Pat. No. 4,632,058, issued Dec. 30, 1986 to Dixon et al. The '058 patent is incorporated herein by reference.

As described in the '058 patent, a variety of efforts have been expended to control factors involved in the deposition process, e.g., layer thickness, resistivity, dopant concentration, etc. These efforts have involved efforts to alter factors such as the physical dimensions of the process chamber, the table or susceptor on which the substrate material is positioned, the temperature and manner of heating of the chamber. Also described in that patent are efforts directed to the shape of the nozzles, or wands, used to deliver the selected gases to the interior of the process chamber.

While such efforts have, to date, enjoyed some degree of success, further improvement in process technology continued to be desired. For example, the '058 patent is directed to establishing a precise relationship in the ratio of height of the process chamber to diameter of the susceptor table. However, both structures are relatively costly and cannot be altered easily. Thus, the requirement of adhering to this ratio meant that other reactors with different ratios did not operate as efficiently as possible, and they could not easily be modified.

Accordingly, a need existed in the industry to provide a better, cleaner and more efficient way to control semiconductor processing in CVD reactors.

SUMMARY OF THE INVENTION

The invention meets the above needs, and overcomes the disadvantages and drawbacks of prior art CVD reactors. The invention teaches a structure and method for delivering the selected gases into the process chamber of the reactor such that superior uniformity of the process can be achieved throughout a large range of reactor types and sizes.

The invention involves introducing the process gases into the chamber through a plurality of coaxially disposed passageways, with the different gases being kept separated from one another until exiting into the chamber. In addition, a dispensing element is disposed within the chamber proximate the outlet end of the gas inlet such that the exiting gases impinge upon the surface of the element and are dispersed relative the semiconductor substrate.

An advantage of the present invention is providing an effective way to achieve consistent, uniform and controlled results in semiconductor processing involving CVD reactors.

Another advantage of the present invention is to achieve such beneficial results in many different types of CVD reactors, e.g., bell, barrel, vertical, horizontal, etc., without limitation due to size or shape of the containment vessel or susceptor.

A further advantage of the present invention is to keep the process gases separate from each other prior to introduction into the process chamber, which contributes to achieving the beneficial results described above.

An additional advantage of the present invention is to keep the process chamber cleaner, as compared to prior art techniques.

The foregoing, and other features and advantages of the invention, will be apparent from the following, more particular, description of the preferred embodiments of the invention, the accompanying drawings and the appended claims.

BRIEF DESCRIPTION OF THE DRAWINGS

FIG. 2A is a cross-sectional view of a gas inlet in accordance with the principles of the invention;

FIG. 2B is a cross-sectional view of a gas inlet in accordance with the principles of the invention, taken at line A—A of FIG. 2A.

DETAILED DESCRIPTION OF THE PREFERRED EMBODIMENTS

Figure 1:
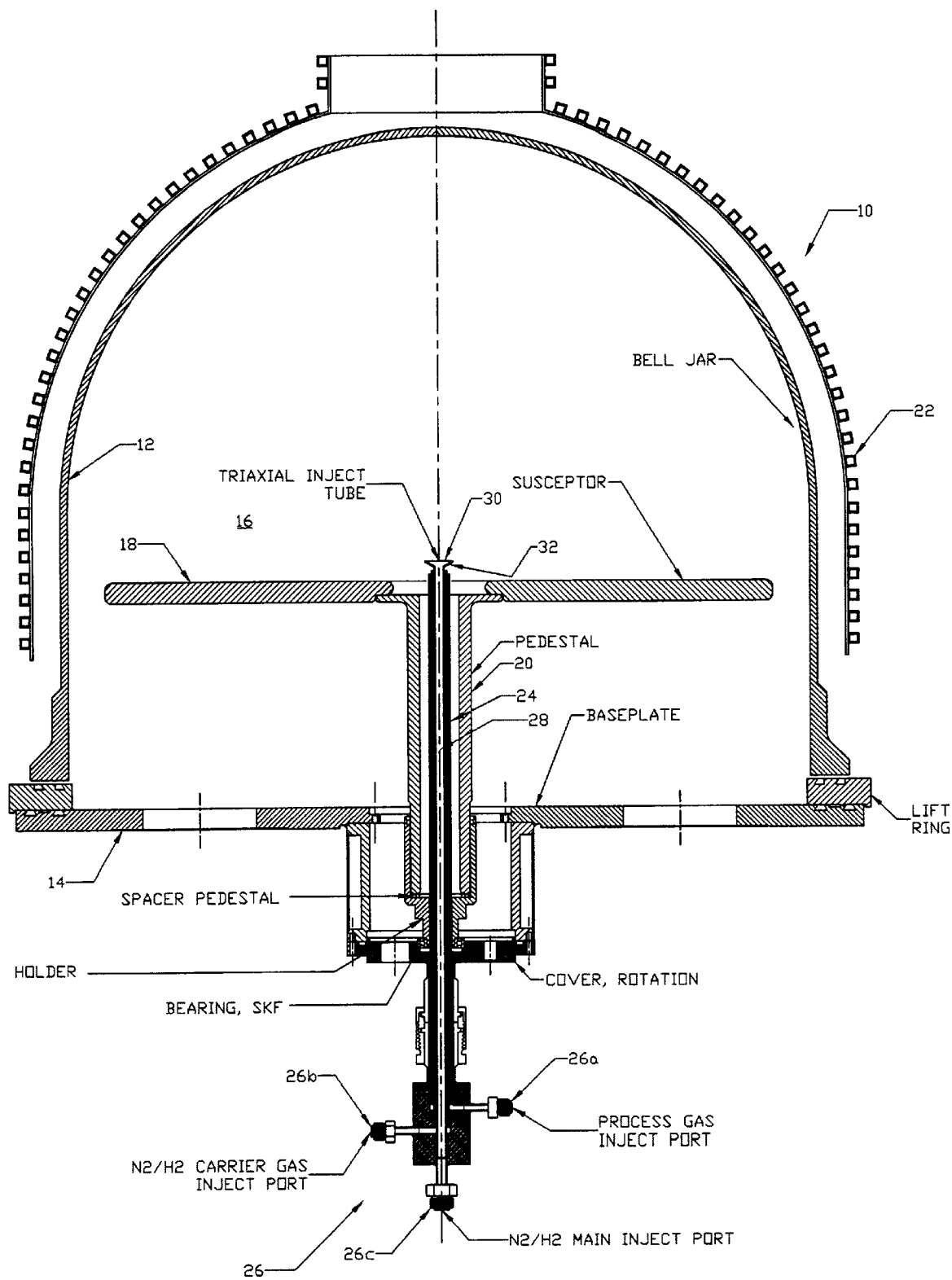
FIG. 1 is a cross-sectional view of a CVD reactor having a gas inlet in accordance with the principles of the invention.

The preferred embodiments of the invention are now described with reference to the figures where like reference numbers indicate like elements Basic components common to CVD reactors are shown in FIG. 1, which further depicts a gas inlet pipe in accordance with the present invention. These components are also described in U.S. Pat. No. 4,632,058, which has been incorporated herein by reference. The depicted CVD reactor 10 includes a bell jar 12 that is removably sealed to a baseplate 14, together defining a process chamber 16 that can be controllably evacuated to form a vacuum or operated atmospherically. Within chamber 16 is a susceptor 18 on which is disposed the semiconductor substrate (not shown) that is the subject of the deposition process. Susceptor 18 is typically mounted on a pedestal 20 so as to be maintained at a desired height above baseplate 14. The chamber can be heated by a variety of means, including but not limited to thermal and RF processes (not shown). In addition, a reflector/shield 22 can be provided about the outer periphery of bell jar 12 so as to assist in the heating process. Variations in these structures are all considered to be within the spirit and scope of the present invention, and need not be described in detail herein.

The processing technique utilizing CVD reactor 10 involves the introduction of various gases into chamber 16 under controlled circumstances. This is accomplished via a gas inlet 24, which can be selectively connected to different sources of gases (not shown) via one or more ports 26 that are external to the environment within chamber 16. Such gases can include, but are not limited to: silane ($SiH_4$); silicon tetrachloride ($SiCl_4$); trichlorosilane ($SiHCl_3$); nitrogen and/or hydrogen, in various combinations ($N_2/H_2$); and other active, inert and/or carrier gases that may also contain various degrees of dopants (N and/or P). The rate of flow of these gases, which ones are introduced, the temperature and/or pressure within the chamber, etc., are all controllable via appropriate electronic circuitry (not shown) that are considered known to persons skilled in this art.

In accordance with the invention, gas inlet 24 includes conduits 28 that define a plurality of coaxially disposed passageways, each communicating at an external end of inlet 24 to a different one of the process gases via respective ports, e.g., 26a, 26b and 26c. The gases are delivered to the interior of process chamber 16 at an outlet end 30 of gas inlet 24. A surface 32 proximate outlet end 30 helps to disperse the process gases in a region near the substrates (not shown) disposed on susceptor 18 within chamber 16. Details of these structures can better be understood by reference to FIGS. 2A–2B and the following description.

FIG. 2A shows, in cross-sectional view, a presently preferred embodiment of a gas inlet in accordance with the invention. Another cross-sectional view, taken along line A—A of FIG. 2A, is included as FIG. 2B. In both figures, gas inlet 24 is depicted as including conduits 24a, 24b and 24c. In this preferred embodiment, each is formed of clear fused quartz tubing so as to withstand the high temperatures and corrosive nature of the processes gases, as well as to remain inert thereto. Conduits 24a, 24b and 24c are coaxially disposed about a common axis and spaced apart from each other via spacers 34. This arrangement results in a series of coaxial passageways: 28a, defined by conduits 24a and 24b; 28b, defined by conduits 24b and 24c; and 28c, which is a passageway internal to conduit 24c. These passageways communicate to the process gas sources (not shown) via respective ports 26a, 26b and 26c (FIG. 1) in the manner described above.

The number of passageways 28 can depend, in part, upon the different number of gases to be introduced simultaneously or sequentially into process chamber 16. Thus, it is considered within the spirit and scope of the present invention to provide more than three such passageways (e.g., four or five or more) as well as fewer (i.e., two). It is also considered within the spirit and scope of the invention to provide such passageways via conduits 24 that may not be circular in cross-section and that may not be coaxially aligned relative to a single or common axis. Thus, triangular, square or other shaped conduits 24 may be employed in accordance with the present invention; additionally, alignment about different axes may be utilized even while maintaining a generally coaxial relationship as between passageways 28.

FIG. 2 further depicts the dispersing surface 32 that is located at outlet end 30 of gas inlet 24, i.e., within the process chamber of the CVD reactor. In a presently preferred embodiment, surface 32 is conical in nature and is disposed at an obtuse angle relative to the axis of coaxial conduits 24a, 24b and 24c. Specifically, surface 32 forms a 120° angle relative to the axis (as measured with respect to the portion of the axis that would be within the conduits; if the axis is envisioned to extend beyond outlet end 30, the angle formed between the projected axis and surface 32 is 60°). Also according to this presently preferred embodiment, dispersing surface 32 is formed integrally with conduit 24c of clear fused quartz. However, other arrangements for providing a dispersing surface at or proximate the outlet end 32 of gas inlet 24 may be employed, and are considered within the spirit and scope of the present invention. For example, surface 32 need not be conical in nature and/or may extend at different angles relative to the axis of gas inlet 24; angles of approximately 30° to 120° may be employed in accordance with the spirit and scope of the present invention.

Process gases introduced through ports 26a, 26b and 26c are carried via passageways 28a, 28b and 28c, respectively, and exit into process chamber 16 of the CVD reactor. The construction of a gas inlet in accordance with the present invention thus keeps the gases separate from one another until entering the reaction chamber. Furthermore, as the gases exit gas inlet 24 at its outlet end 30, they generally impinge upon angled surface 32 and are dispersed across the semiconductor material in the chamber. In the presently preferred embodiment illustrated in FIGS. 1 and 2A–2B, surface 32 is directly impinged by process gases exiting from passageways 28a and 28b. Surface 32 is not in the direct path of process gas exiting from passageway 28c; thus, gas exiting from passageway 28c (formed by the innermost conduit) is directed generally upwardly within process chamber 16. This arrangement serves to keep the reaction chamber walls clean, which is important if temperature sensing (not shown) is being done through the top of the chamber. It is believed that this arrangement also creates a venturi effect which facilitates dispersion of the gases in a more efficient manner within process chamber 16.

From the foregoing, it can be appreciated that the present invention also constitutes a method for introducing process gas into the chamber of a CVD reactor. More specifically, the method involves introducing a first gas stream into process chamber 16 via a passageway (e.g., 28c) and introducing a second gas stream into process chamber 16 via a passageway (e.g., 28b) disposed coaxially about the other passageway so that the second gas stream is kept separate from the first gas stream. As it is introduced into process chamber 16, the second gas stream impinges upon conical surface 32 disposed at an obtuse angle relative to the flow of the gas stream. The inventive method contemplates providing additional gas streams via other coaxially-disposed passageways (e.g., 28a) and impinging such additional gas streams upon dispersing surface 32.

The gas inlet structure and method herein described has been found to permit highly uniform and desirable manufacturing results to be achieved by adjusting the gas flows, the flare angle of surface 32, and the height of outlet end 30 above susceptor 18. In the presently preferred embodiment, the following dimensions and materials have been utilized:

Conduits—24a: 17 mm ID×19 mm OD quartz tubing, 18.03" long
    24b: 12 mm ID×14 mm OD quartz tubing, 18.96" long
    24c: 7 mm ID×9 mm OD quartz tubing, 20.30" long (including the far end of surface 32)

Bell Jar—22" to 28" high; approximately 29" in diameter (outer)

Susceptor—11.81" radius, disposed 9.03" above the baseplate

The presently preferred embodiment further includes providing extended portions of conduits 24a, 24b and 24c in the manner illustrated in FIG. 2A. Specifically, at the end that is external to the process chamber, conduit 24c extends 1" beyond conduit 24b, and conduit 24b extends 0.81" beyond conduit 24a. This arrangement allows the gas inlet to be supported by a base 34 (FIG. 1) with respective ports 26a, 26b and 26c in communication with passageways 28a, 28b and 28c. Various mechanical arrangements suitable as base 34 are believed to be apparent to persons of ordinary skill in view of the foregoing description, and need not be described further.

Also as shown in FIG. 2A, outlet end 30 in the preferred embodiment includes a portion of conduit 24b that extends beyond the end of conduit 24a by 0.12". The neck of conduit 24c (i.e., before surface 32 begins) extends beyond the end of conduit 24b by 0.22". The height of outlet end 30 of gas inlet 24 above susceptor 18 is adjustable, from 0.25" to 0.75". However, dimensions other than those used in the preferred embodiment may be utilized (including disposing surface 32 other than at the 120° depicted in FIG. 2A), all without departing from the spirit and scope of the present invention.

Figure 3A:
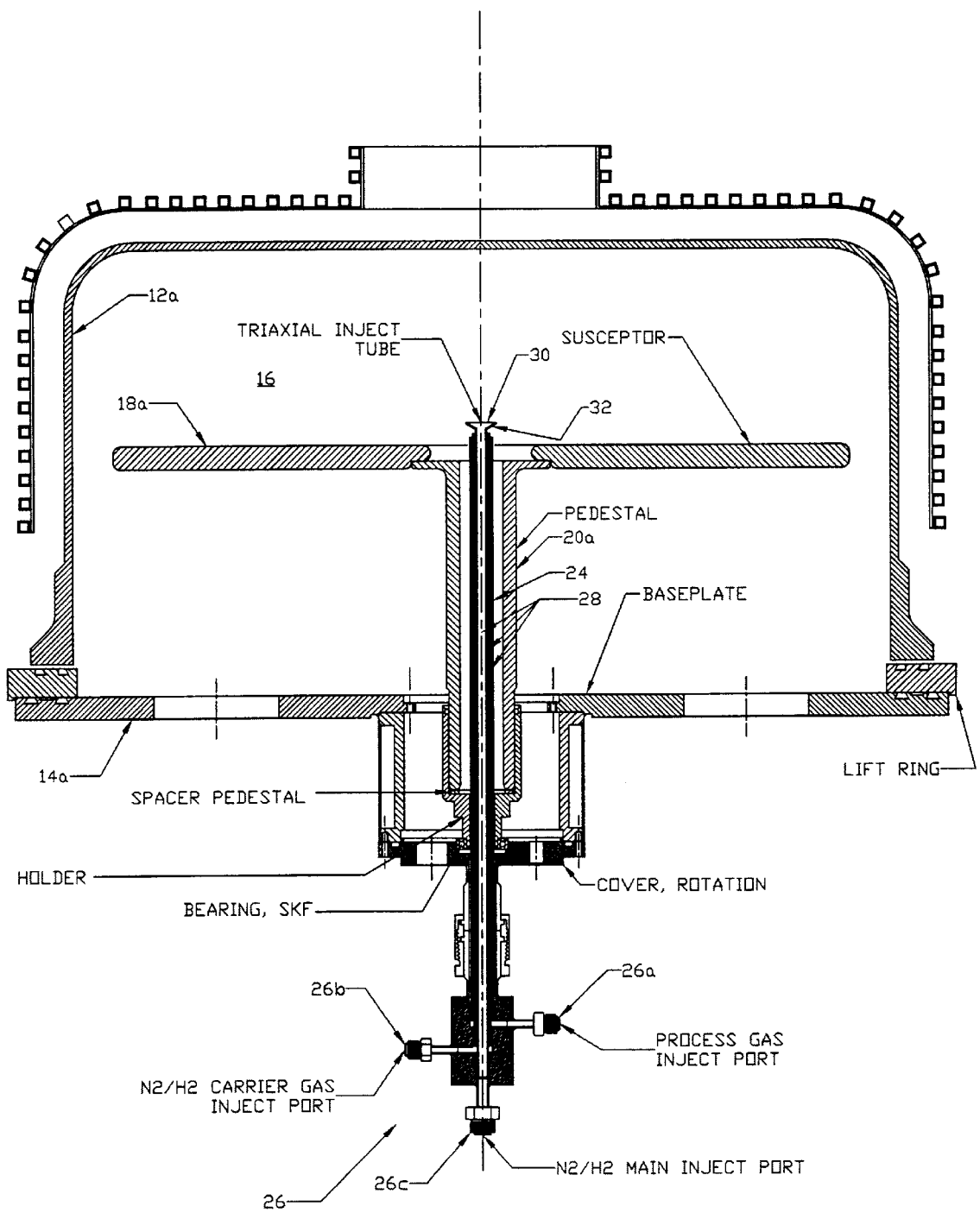
FIGS. 3A–3C are cross-sectional diagrams depicting various CVD reactor chambers in which the gas inlet of the present invention may be utilized.
Figure 3B:
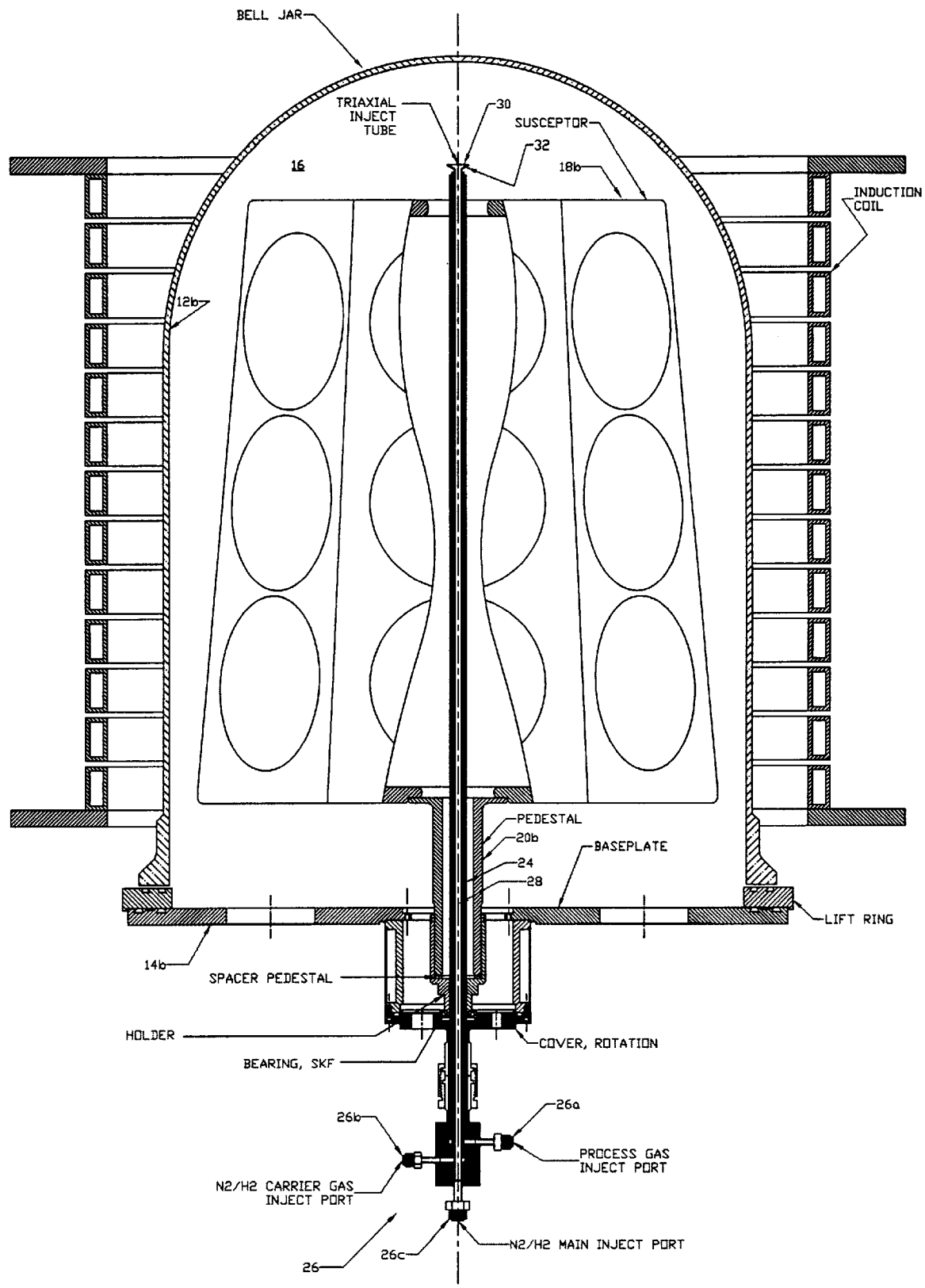
Figure 3C:
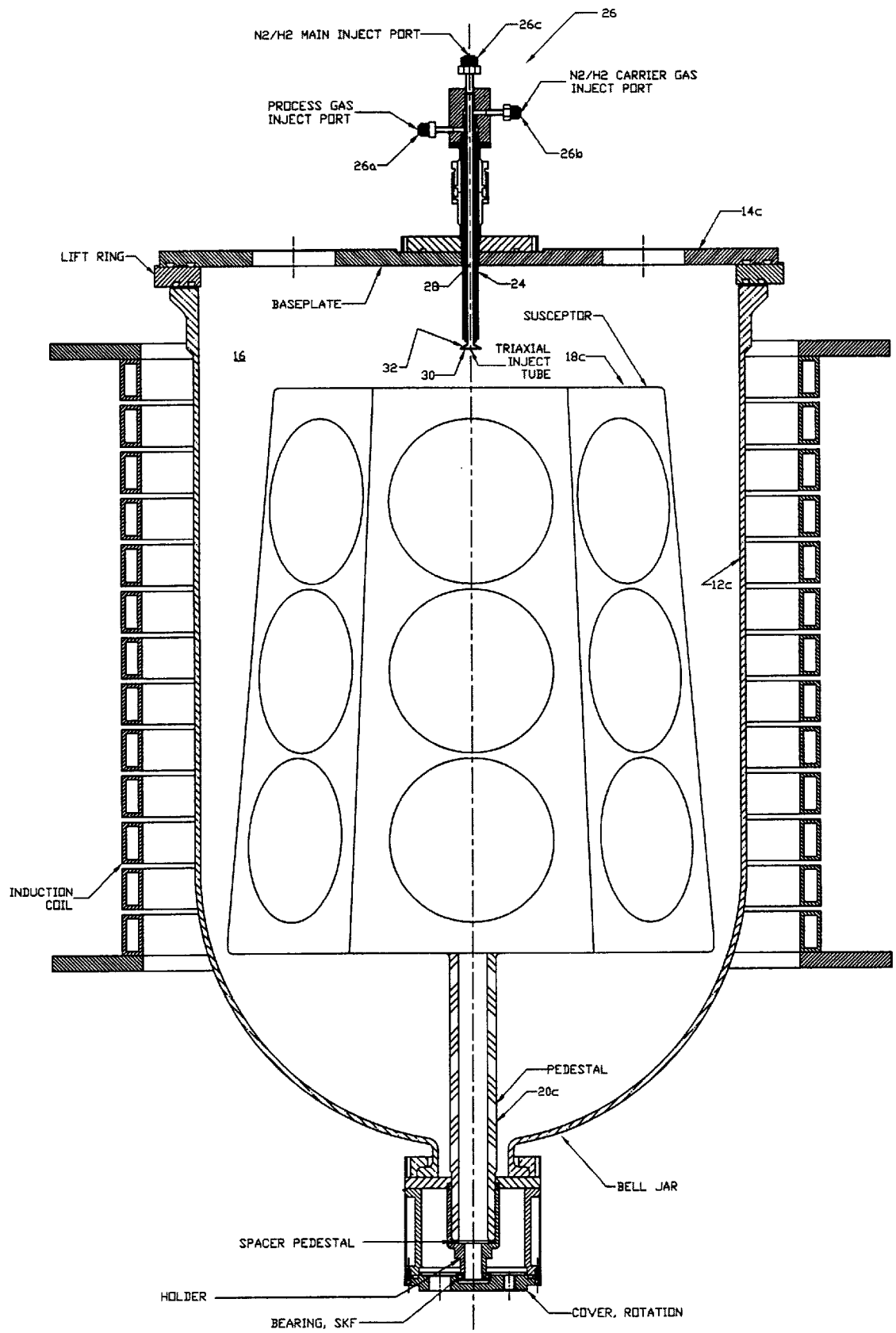

The present invention can be used with different types of CVD reactors, bell jars and susceptors since it has been found that uniformity of deposition can be controlled through metered gas flow. By way of example, some of the various jars and susceptors that can be used include, but are not limited, to those shown in FIGS. 3A–C. Specifically, FIG. 3A illustrates a flat surfaced jar 12a with a radially disposed susceptor 18a mounted on a pedestal 20a with a base plate 14a. FIG. 3B illustrates a bell jar 12b with a susceptor 18b disposed at a downwardly projecting angle and mounted on a pedestal 20b with a base plate 14b. FIG. 3C illustrates an inverted jar 12c with a susceptor 18c disposed angularly therein and mounted on a pedestal 20c with a base plate 14c. Each of these is provided with a gas inlet 24 and dispersing surface 32 in accordance with the present invention. Overall, various types of heating arrangements may be utilized (e.g., induction, radiant, or RF), various types of reactor classes can be utilized (e.g., hot wall or cold wall reactors) and different types of reactors (e.g., vertical, horizontal slab, or cylinder), also without departing from the spirit and scope of the invention.

In addition, the present invention may be used with CVD reactors other than those performing epitaxial deposition processes. For example, the inventive structure and method can be used in CVD reactors performing polysilicon, silicon dioxide or silicon nitride processes, as well as other nitride and oxide deposition processes. Also, the structure and method may be used in CVD reactors that are depositing materials other than p- and n-type dopants, e.g., tungsten deposition processes and those involving other metals. Such processes will, of course, involve the introduction of process gases different from those described hereinabove; however, those gases can be introduced into the process chamber of the respective CVD reactor in accordance with the teachings of this invention.

Numerous benefits of an efficacious nature result from the present invention as compared to prior art CVD reactor techniques. For example, the volume of required process gases is reduced on the order of 30% to 40% relative to prior art techniques (e.g., from 300 liters/min. to 100 liters/min. with regard to hydrogen usage). The present invention permits a shorter reactor jar as compared to prior art arrangements; this translates into lowered thermal losses, better heat reflectivity and overall power savings of at least 8% to 10%.

Other benefits that flow from the use of a smaller jar include: the cost and manufacturing burden of the jar is considerably lower, and overall height of the CVD reactor is minimized (thus avoiding interference with ceiling features, such as exhaust ducts, etc.).

While the invention has been particularly shown and described with reference to the presently preferred embodiments thereof, it will be understood by those skilled in the art that various changes in form and details may be made therein without departing from the spirit and scope of the invention as defined in the appended claims.

What is claimed is:

1. In a chemical vapor deposition reactor, having a process chamber into which a plurality of gas streams are introduced for purposes of depositing material on substrate disposed on a susceptor within the chamber, a gas inlet pipe comprising: a plurality of coaxially arranged conduits that are spaced radially apart, the space between said conduits defining a passageway to carry a first respective one of the gas streams, and a dispersing element in the chamber proximate the ends of said conduits, the element having a conical surface disposed coaxially about said conduits and at an angle of approximately 30° to 120° relative thereto.

2. The chemical vapor deposition reactor of claim 1, wherein the number of conduits is two.

3. The chemical vapor deposition reactor of claim 2, wherein the inner-most conduit includes an interior passageway to carry a second one of the gas streams.

4. The chemical vapor deposition reactor of claim 1, wherein the number of conduits is three.

5. The chemical vapor deposition reactor of claim 4, wherein the inner-most conduit includes an interior passageway to carry a second one of the gas streams, and the respective spaces between the inner-most, intermediate and outer-most conduits separately carry the first one of the gas streams and a third one of the gas streams.

6. The chemical vapor deposition reactor of claim 1, wherein the angle of the conical surface of the dispersing element is approximately 120° relative to the axis of said conduits.

7. The chemical vapor deposition reactor of claim 1, wherein said plurality of conduits includes an inner-most tube having an interior passageway to carry a second one of the gas streams, and said dispersing element is disposed so as not to deflect exiting of said second one of the gas streams from said inner-most tube.

8. A method for introducing multiple gas streams into a chamber of a chemical vapor deposition reactor, comprising the steps of:

introducing a first one of the gas streams into the chamber via a first passageway;

carrying a second one of the gas streams in a second passageway disposed coaxially about said first passageway so that the second gas stream is kept separate from the first gas stream; and introducing the second gas stream into the chamber by impinging the second gas stream upon a conical surface disposed at an angle of approximately 30° to 120° relative to the flow of the second gas stream.

9. The method of claim 8, further comprising the steps of:

carrying a third one of the gas streams in a third passageway disposed coaxially about said first and second passageways, the third gas stream being kept separate from the first and second gas streams, and introducing the third gas stream into the chamber by impinging the third stream upon said conical surface.

10. The method of claim 9 wherein said angle is approximately 120°.

11. A chemical vapor deposition reactor into which a plurality of gas streams can be introduced for depositing material on a substrate, comprising:

a process chamber;

a susceptor within said chamber and adapted to support the substrate;

a gas inlet pipe for introducing selected ones of the plurality of gas streams into said process chamber, said pipe having a plurality of coaxially arranged conduits that are spaced radially apart, the space between said conduits defining a passageway to carry a first respective one of the gas streams; and a dispersing element in said chamber proximate the ends of said conduits, said element having a conical surface disposed coaxially about said conduits and at an angle of approximately 30° to 120° relative thereto.

12. The chemical vapor deposition reactor of claim 11, wherein the number of conduits is two.

13. The chemical vapor deposition reactor of claim 12, wherein the inner-most conduit includes an interior passageway to carry a second one of the gas streams.

14. The chemical vapor deposition reactor of claim 11, wherein the number of conduits is three.

15. The chemical vapor deposition reactor of claim 14, wherein the inner-most conduit includes an interior passageway to carry a second one of the gas streams, and the respective spaces between the inner-most, intermediate and outer-most conduits separately carry the first one of the gas streams and a third one of the gas streams.

16. The chemical vapor deposition reactor of claim 11, wherein the angle of the conical surface of the dispersing element is approximately 120° relative to the axis of said conduits.

17. The chemical vapor deposition reactor of claim 11, wherein said plurality of conduits includes an inner-most tube have an interior passageway to carry a second one of the gas streams, and said dispersing element is disposed so as not to deflect exiting of said second one of the gas streams from said inner-most tube.

* * * * *